（12） United States Patent
Qian et al.

(10) Patent No.: US 8,637,959 B2
(45) Date of Patent: Jan. 28, 2014

(54) VERTICAL PARASITIC PNP DEVICE IN A BICMOS PROCESS AND MANUFACTURING METHOD OF THE SAME

(75) Inventors: Wensheng Qian, Shanghai (CN); Donghua Liu, Shanghai (CN); Jun Hu, Shanghai (CN)

(73) Assignee: Shanghai Hua Hong NEC Electronics, Shanghai (CN)

(*) Notice: Subject to any disclaimer, the term of this patent is extended or adjusted under 35 U.S.C. 154(b) by 168 days.

(21) Appl. No.: 13/220,485

(22) Filed: Aug. 29, 2011

(65) Prior Publication Data
US 2012/0049327 A1    Mar. 1, 2012

(30) Foreign Application Priority Data

Aug. 31, 2010 (CN) .......................... 2010 1 0270115

(51) Int. Cl.
*H01L 21/02* (2006.01)

(52) U.S. Cl.
USPC .... 257/586; 257/197; 257/592; 257/E21.608; 257/E29.183; 257/E21.375; 438/189; 438/202; 438/222; 438/315; 438/318

(58) Field of Classification Search
None
See application file for complete search history.

(56) References Cited

U.S. PATENT DOCUMENTS

| | | | | |
|---|---|---|---|---|
| 6,054,344 A | * | 4/2000 | Liang et al. | 438/223 |
| 2005/0017306 A1 | * | 1/2005 | Morishita | 257/355 |

* cited by examiner

*Primary Examiner* — Julio J Maldonado
*Assistant Examiner* — Yasser Abdelaziez
(74) *Attorney, Agent, or Firm* — Blakely Sokoloff Taylor & Zafman (57) ABSTRACT

The invention discloses a vertical parasitic PNP transistor in a BiCMOS process and manufacturing method of the same, wherein an active region is isolated by STIs. The transistor includes a collector region, a base region, an emitter region, pseudo buried layers, and N-type polysilicon. The pseudo buried layers, formed at the bottom of the STIs located on both sides of the collector region, extend laterally into the active region and contact with the collector region, whose electrodes are picked up through making deep-hole contacts in the STIs. The N-type polysilicon is formed on the base region and contacts with it, whose electrodes are picked up through making metal contacts on the N-type polysilicon. The transistors can be used as output devices in high-speed and high-gain circuits, efficiently reducing the transistors area, diminishing the collector resistance, and improving the transistors performance. The method can reduce the cost without additional technological conditions.

8 Claims, 5 Drawing Sheets

VERTICAL PARASITIC PNP DEVICE IN A BICMOS PROCESS AND MANUFACTURING METHOD OF THE SAME

CROSS-REFERENCE TO RELATED APPLICATIONS

This application claims the priority of Chinese patent application number 201010270115.4, filed on Aug. 31, 2010, the entire contents of which are incorporated herein by reference.

BACKGROUND OF THE INVENTION

1. Field of the Invention

The present invention relates to the manufacturing field of semiconductor integrated circuits and, more particularly, to a vertical parasitic PNP transistor in a BiCMOS process. The present invention also relates to a manufacturing method of the vertical parasitic PNP transistor in a BiCMOS process.

2. Description of Related Art

Higher and higher cutoff frequency of devices is required for radio frequency (RF) applications. In BiCMOS processes, NPN transistors, particularly Silicon-Germanium heterojunction transistors (SiGe HBT), are good choice for ultra-high frequency devices. Besides, the SiGe process is basically compatible with the silicon process, therefore SiGe HBT has been one of the mainstream ultra-high frequency devices. Under this background, the demands on output devices are correspondingly increasing, for example, the output devices are required to have certain current gain factor and cut-off frequency.

Now, output devices can adopt vertical parasitic PNP transistors. And in the present BiCMOS process, the collector of the vertical parasitic PNP transistor is often picked up through the following way: first forming a buried layer or a well at the bottom of a shallow trench isolation (STI) or shallow trench field oxide in such a way that the buried layer or the well contacts with the collector region of the device which is formed in an active region and picks up the collector region into another active region adjacent to the collector region, and then forming a metal contact in the another active region to pick up the collector (the electrode of the collector region). This way is determined by the characters of the vertical structure of the device. Its disadvantage is the large device area and the large connecting resistance of the collector. Because the collector is picked up through another active region adjacent to the collector region and the another active region needs to be isolated from the collector region by STI or other filed oxides, further reduction of the size of the device is greatly limited.

SUMMARY OF THE INVENTION

An objective of the invention is to provide a vertical parasitic PNP transistor in a BiCMOS process, which can be used as output devices in high-speed and high-gain BiCMOS circuits to provide another choice of devices for the circuits, efficiently decreasing the area of the devices, reducing the collector resistance of PNP transistor, and improving the performance of the devices. The present invention also provides a manufacturing method of vertical parasitic PNP device in a BiCMOS process, which can reduce costs without additional process conditions.

To achieve the above objective, the invention provides a vertical parasitic PNP transistor in a BiCMOS process, formed on a silicon substrate, wherein an active region is isolated by shallow trench isolations, the vertical parasitic PNP transistor comprises:

a collector region, comprising a P-type ion implantation region formed in the active region, wherein the collector region is deeper than or equal to the bottom of the shallow trench isolations;

pseudo buried layers, comprising P-type ion implantation regions formed at the bottom of the shallow trench isolations located on both sides of the collector region, wherein the pseudo buried layers extend laterally into the active region and contact with the collector region, and the electrodes of the collector region are picked up through deep-hole contacts formed on the top of the pseudo buried layers through the shallow trench isolations;

a base region, comprising an N-type ion implantation region formed on the collector region and contacting with the collector region;

an emitter region, comprising a P-type Silicon-Germanium epitaxial layer formed on the base region and contacting with the base region, wherein the electrode of the emitter region is directly picked up through a metal contact;

N-type polysilicon, formed on the base region and contacting with the base region, wherein the electrodes of the base region are picked up through metal contacts on the N-type polysilicon.

In one embodiment of the invention, the impurity implanted in the collector region through the P-type ion implantation is boron, and the implantation is realized through two steps: the dose for the implantation in Step 1 is $1e11\ cm^{-2} \sim 5e13\ cm^{-2}$, and the energy for the implantation in Step 1 is 100 keV~300 keV; the dose for the implantation in Step 2 is $5e11\ cm^{-2} \sim 1e13\ cm^{-2}$, and the energy for the implantation in Step 2 is 30 keV~100 keV.

In one embodiment of the invention, the process conditions of the P-type ion implantation for the pseudo buried layers are: the dose for the implantation is $1e14\ cm^{-2} \sim 1e16\ cm^{-2}$, the energy for the implantation is less than 15 keV, and the impurity implanted is boron or boron difluoride.

In one embodiment of the invention, the process conditions of the N-type ion implantation for the base region are: the impurity implanted is phosphor or arsenic, the energy for the implantation is 100 Kev~300 Kev, and the dose for the implantation is $1e12\ cm^{-2} \sim 1e14\ cm^{-2}$.

In one embodiment of the invention, the P-type Silicon-Germanium pseudo buried layer of the emitter region is doped through ion implantation, and the process conditions for the doping are: the dose for the implantation is $5e14\ cm^{-2} \sim 5e15\ cm^{-2}$, the energy for the implantation is less than 10 keV, and the impurity implanted is boron or boron difluoride.

In one embodiment of the invention, the N-type polysilicon is doped through ion implantation, and the process conditions are: the dose for the implantation is $1e14\ cm^{-2} \sim 1e16\ cm^{-2}$, the energy for the implantation is 150 keV~200 keV, and the impurity implanted is arsenic or phosphor.

In one embodiment of the invention, the size of the emitter region is smaller than that of the active region, and the size of the emitter region is defined by a base region window formed in a first medium layer formed on the silicon substrate, and the base region window is formed through etching part of the first medium layer on the active region, and the base region window is located on the active region and is smaller than the active region.

In one embodiment of the invention, the N-type polysilicon is isolated from the emitter region by a second medium layer.

To achieve the above objective, the invention also provides a manufacturing method of a vertical parasitic PNP transistor in a BiCMOS process, the method comprises:

Step 1: forming an active region and shallow trenches in a silicon substrate through etching process;

Step 2: forming a base region in the active region through N-type ion implantation, wherein the depth of the base region is less than the depth of the bottom of the shallow trenches;

Step 3: forming pseudo buried layers at the bottom of the shallow trenches through P-type ion implantation;

Step 4: conducting an annealing process, wherein the pseudo buried layers extend laterally and vertically into the active region;

Step 5: forming shallow trench isolations though filling silicon oxide into the shallow trenches;

Step 6: forming a collector region in the active region through P-type ion implantation, wherein the collector region is deeper than or equal to the bottom of the shallow trench isolations and contacts with the pseudo buried layers;

Step 7: forming an emitter region through growing and then etching a P-type Silicon-Germanium epitaxial layer on the active region, wherein the emitter region is smaller than the active region and contacts with the base region;

Step 8: forming N-type polysilicon on the base region, wherein the N-type polysilicon contacts with the base region;

Step 9: picking up the electrodes of the collector region through forming deep-hole contacts on the top of the pseudo buried layers in the shallow trench isolations; picking up the electrodes of the base region though forming metal contacts of the base region; and picking up the electrode of the emitter region though forming a metal contact of the emitter region.

In one embodiment of the invention, the etching process in Step 1 adopts a hard mask made of silicon nitride which is formed on the surface of the active region in the silicon substrate, and the N-type ion is implanted into the active region through passing through the hard masking during the N-type ion implantation for the base region in Step 2, and the process conditions of the N-type ion implantation for the base region are: the impurity implanted is phosphor or arsenic, the energy for the implantation is 100 Kev~300 Kev, and the dose for the implantation is 1e12 cm$^{-2}$~1e14 cm$^{-2}$.

In one embodiment of the invention, the process conditions of the P-type ion implantation for the pseudo buried layers in Step 3 are: the dose for the implantation is 1e14 cm$^{-2}$~1e16 cm$^{-2}$, the energy for the implantation is less than 15 keV, and the impurity implanted is boron or boron difluoride.

In one embodiment of the invention, the process conditions of the annealing process in Step 4 are: the temperature is 900° C.~1100° C., and the time is 10 minutes~100 minutes.

In one embodiment of the invention, the impurity implanted of the P-type ion implantation for the collector region in Step 6 is boron, and the implantation can be realized through two steps: the dose for the implantation in step 1 is 1e11 cm$^2$~5e13 cm$^{-2}$, and the energy for the implantation in step 1 is 100 keV~300 keV; the dose for the implantation in step 2 is 5e11 cm$^{-2}$~1e13 cm$^{-2}$, and the energy for the implantation in step 2 is 30 keV~100 keV.

In one embodiment of the invention, the position and size of the emitter region in Step 7 are defined by a base region window formed in a first medium layer, which includes the following steps: forming the first medium layer on the silicon substrate; etching part of the first medium layer to form the base region window, which is located on the active region and is smaller than the active region; growing a P-type Silicon-Germanium epitaxial layer both in the base region window and on the first medium layer and etching it to form the emitter region, wherein the P-type Silicon-Germanium epitaxial layer formed inside the base region window contacts with the base region, and the P-type Silicon-Germanium epitaxial layer formed outside the base region window is smaller than the active region and is isolated from the base region by the first medium layer. The P-type Silicon-Germanium epitaxial layer of the emitter region is doped through ion implantation, the process conditions for doping are: the dose for the implantation is 5e14 cm$^{-2}$~5e15 cm$^{-2}$, the energy for the implantation is less than 10 keV, and the impurity implanted is boron or boron difluoride.

In one embodiment of the invention, the N-type polysilicon is formed in Step 8 through the following steps: forming a second medium layer on the silicon substrate; etching the second medium layer to make the second medium layer totally cover the emitter region and the covered area is smaller than the active region, and eliminating all the second medium layer outside the covered area; depositing N-type polysilicon to make the N-type polysilicon contact with the base region and be isolated from the emitter region by the second medium layer.

In one embodiment of the invention, the N-type polysilicon is doped through ion implantation, and the process conditions for the doping are: the dose for the implantation is 1e14 cm–2~1e16 cm–2, the energy for the implantation is 150 keV~200 keV, and the impurity implanted is arsenic or phosphor.

The vertical parasitic PNP transistor in a BiCMOS process in the present invention has a higher current amplification coefficient and better frequency characteristics. Therefore, the vertical parasitic PNP device can be used as output devices in high-speed and high-gain BiCMOS circuits to provide another choice of devices for the circuits. In the present invention, the collector of the transistor is picked up though the advanced deep-hole contact process to directly contact the P-type pseudo buried layers, which can reduce the area of the device efficiently. Additionally, the reduction of the distance from the picked-up position to the collector region as well as the highly doped P-type pseudo buried layers can efficiently reduce the resistance of the collector of the transistor, improving the frequency characteristics without affecting the current gain. The manufacturing method in the present invention adopts traditional BiCMOS process, which can reduce the cost.

BRIEF DESCRIPTION OF THE DRAWINGS

These and other features, aspects, and advantages of the present invention will become better understood with regard to the following description, appended claims, and accompanying drawings.

DETAILED DESCRIPTION OF THE INVENTION

Figure 1:
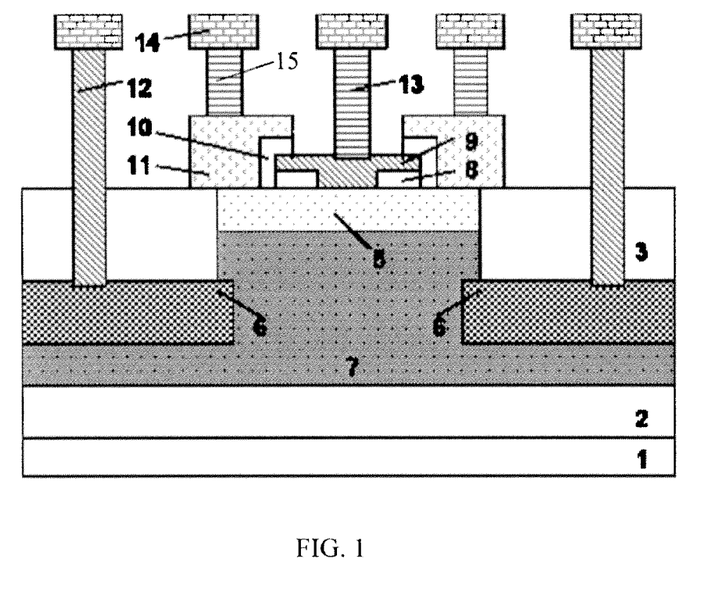
FIG. 1 is a structural diagram of the vertical parasitic PNP transistor in a BiCMOS process in an embodiment of the present invention.

As shown in FIG. 1, which is a structural diagram of the vertical parasitic PNP transistor in a BiCMOS process in an embodiment of the present invention, the vertical parasitic PNP transistor is formed on a P-type silicon substrate 1 and an N-type deep well 2 is formed in the P-type silicon substrate 1. Active regions are isolated by shallow trench isolations (STIs) 3. The vertical parasitic PNP transistor includes:

A collector region 7, consisting of a P-type ion implantation region formed in the active region, which is deeper than or equal to the bottom of the STIs 3. The impurity implanted in the collector region 7 is boron and the P-type ion implantation can be realized through two steps of implantation: the dose for the implantation in step 1 is 1e11 $cm^{-2}$~5e13 $cm^{-2}$, and the energy for the implantation is 100 keV~300 keV; the dose for the implantation in step 2 is 5e11 $cm^{-2}$~1e13 $cm^{-2}$, and the energy for the implantation is 30 keV~100 keV.

Pseudo buried layers 6, consisting of P-type ion implantation regions formed at the bottom of the STIs 3 on both sides of the collector region 7, extending laterally into the active region and contacting with the collector region 7. And deephole contacts 12 are formed on the top of the pseudo buried layers 6 through the STIs 3 to pick up the collectors (the electrodes of the collector region). The process conditions of the P-type ion implantation of the pseudo buried layers 6 are: the dose for the implantation is 1e14 $cm^{-2}$~1e16 $cm^{-2}$, the energy for the implantation is less than 15 keV, and the impurity implanted is boron or boron di fluoride.

A base region 5, consisting of an N-type ion implantation region which is formed on the top of the collector region 7 and contacts with the collector region 7. The process conditions of the N-type ion implantation of the base region 5 are: the impurity implanted is phosphor or arsenic, the energy for the implantation is 100 Kev~300 Kev, and the dose for the implantation is 1e14 $cm^{-2}$~1e16 $cm^{-2}$.

An emitter region 9, consisting of a P-type Silicon-Germanium epitaxial layer formed on the top of the base region 5 and contacting with the base region 5. And the emitter (the electrode of the emitter region) is directly picked up through a metal contact. The size of the emitter region 9 is smaller than that of the active region, wherein the size of the emitter region 9 is defined by a base region window formed in a first medium layer 8 which is formed on the silicon substrate 1. The base region window is formed through etching part of the first medium layer 8 on the top of the active region located on the silicon substrate 1, wherein the base region window is located on the active region and is smaller than the active region. The P-type Silicon-Germaniun epitaxial layer formed inside the base region window contacts with the base region 5, and the P-type Silicon-Germaniun epitaxial layer formed outside the base region window is isolated from the base region 5 by the first medium layer 8. The P-type Silicon-Germaniun epitaxial layer of the emitter region 9 is doped through ion implantation. The process conditions for the doping are: the dose for the implantation is 5e14 $cm^{-2}$–5e15 $cm^{-2}$, the energy for the implantation is less than 10 keV, and the impurity implanted is boron or boron difluoride.

N-type polysilicon 11, formed on the top of the base region 5 and contacting with the base region 5. And the base (the electrodes of the base region) is picked up through forming metal contacts on the N-type polysilicon 11. The N-type polysilicon 11 is isolated from the emitter region 9 by a second medium layer 10. The N-type polysilicon 11 is doped through ion implantation, and the process conditions for the doping are: the dose for the implantation is 1e14 $cm^{-2}$~1e16 $cm^{-2}$ the energy for the implantation is 150 keV~200 keV, and the impurity for the implantation is arsenic or phosphor.

Figure 2A:
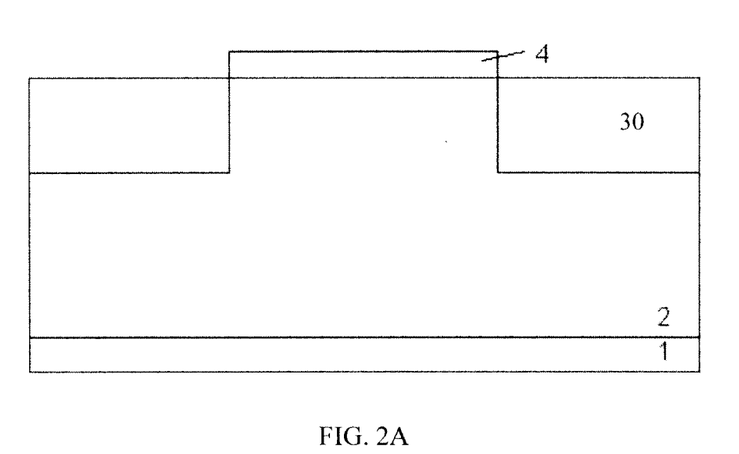
FIGS. 2A-2G are structural diagrams of the vertical parasitic PNP transistor in the manufacturing process of an embodiment of the present invention.

As shown in FIGS. 2A-2G, which are structural diagrams of the vertical parasitic PNP transistor in the manufacturing process of an embodiment of the present invention, the manufacturing method of the vertical parasitic PNP transistor in a BiCMOS process in the embodiment of the present invention includes the following steps:

Step 1: as shown in FIG. 2A, forming an active region and shallow trenches 30 in a P-type silicon substrate 1 through etching process. The etching process adopts a hard mask 4 made of silicon nitride and the forming process of the hard mask 4 includes: first growing a silicon nitride layer on the silicon substrate, and then removing part of the silicon nitride which is located on the region for forming the shallow trenches 30 through the photoetching process, the remaining silicon nitride constitutes the hard mask 4 only covering the surface of the active region on the silicon substrate 1. After the shallow trenches 30 are formed, a deep well 2 is formed through N-type deep well implantation.

Figure 2B:
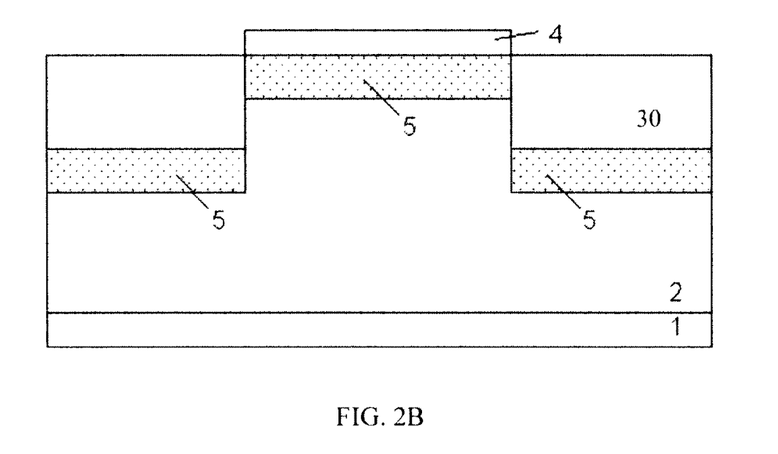

Step 2: as shown in FIG. 2B, forming a base region 5 in the active region through N-type ion implantation, wherein the depth of the base region 5 is smaller than the depth of the bottom of the shallow trenches 30. During the N-type ion implantation of the base region 5, the N-type ion is implanted into the active region by passing through the hard mask 4, and the process conditions of the N-type ion implantation of the base region 5 are: the impurity implanted is phosphor or arsenic, the energy for the implantation is 100 Kev~300 Kev and the dose for the implantation is 1e12 $cm^{-2}$~1e14 $cm^{-2}$. During the N-type ion implantation of the base region 5, the N-type ion is simultaneously implanted into the silicon substrate at the bottom of the shallow trenches 30.

Figure 2C:
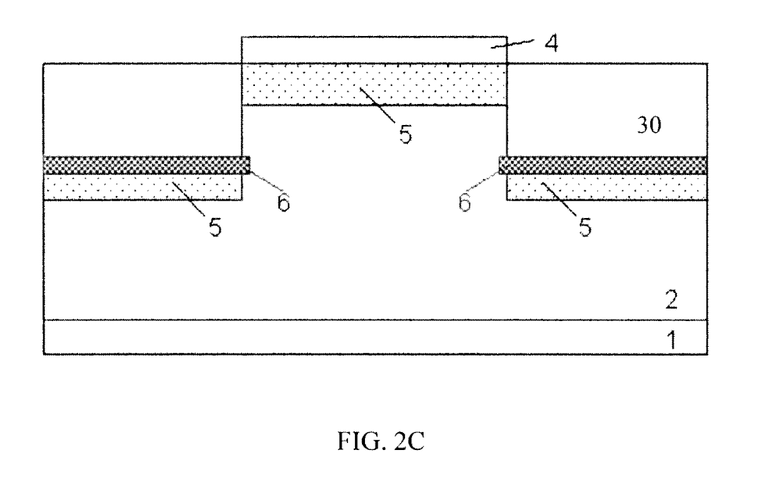

Step 3: as shown in FIG. 2C, forming pseudo buried layers 6 at the bottom of the shallow trenches 30 through P-type ion implantation. The process conditions of the P-type ion implantation of the pseudo buried layers 6 are: the dose for the implantation is 1e14 $cm^{-2}$~1e16 $cm^{-2}$, the energy for the implantation is less than 15 keV, and the impurity implanted is boron or boron difluoride.

Figure 2D:
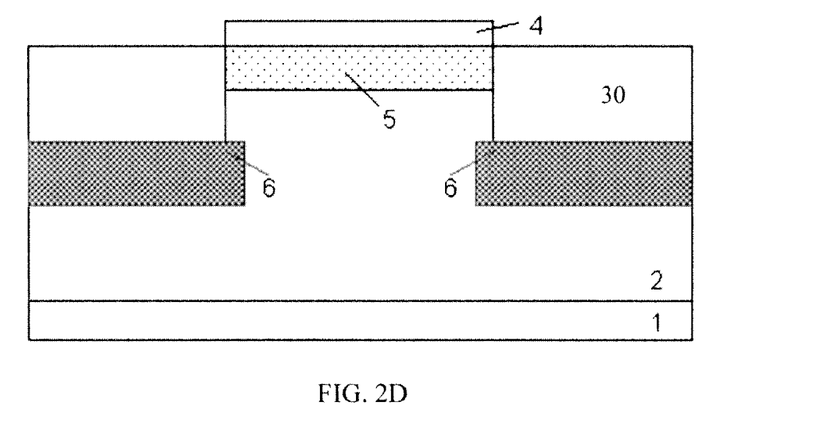

Step 4: as shown in FIG. 2D, conducting annealing process. And the pseudo buried layers 6 extend laterally and vertically into the active region. The process conditions of the annealing are: the temperature is 900° C.~1100° C., and the time is 10 minutes~100 minutes.

Figure 2E:
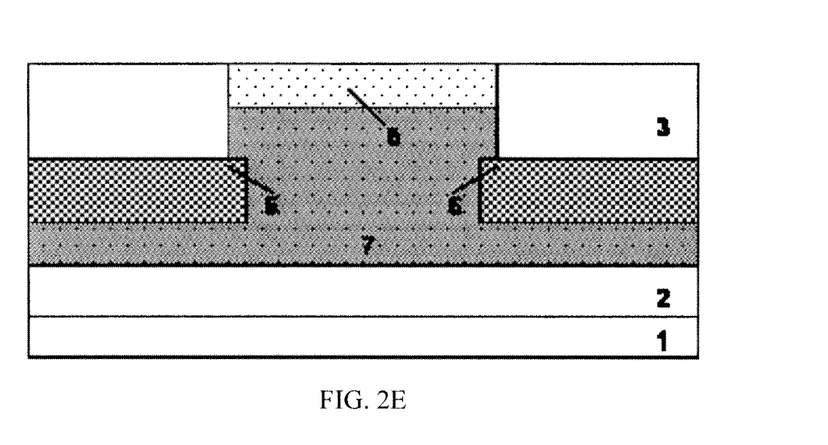

Step 5: as shown in FIG. 2E, forming shallow trench isolations (STIs) 3 through filling silicon oxide into the shallow trenches 30.

Step 6: as shown in FIG. 2E, forming a collector region 7 in the active region through P-type ion implantation, wherein the collector region 7 is deeper than or equal to the bottom of the STIs 3 and contacts with the pseudo buried layers 6. The P-type ion implantation of the collector 7 adopts conventional CMOS P well implantation process, and the impurity implanted is boron, wherein the implantation can be realized through two steps: the dose for the implantation in step 1 is 1e11 $cm^{-2}$~5e13 $cm^{-2}$, and the energy for the implantation in Step 1 is 100 keV~300 keV; the dose for the implantation in Step 2 is 5e11 $cm^{-2}$~1e13 $cm^{-2}$, and the energy for the implantation in Step 2 is 30 keV~100 keV.

Figure 2F:
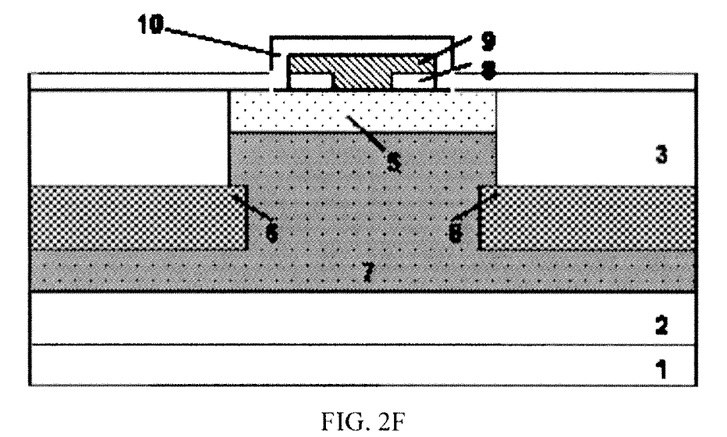

Step 7: as shown in FIG. 2F, forming an emitter region 9 through growing and then etching a P-type Silicon-Germanium epitaxial layer on the active region, wherein the emitter region 9 is smaller than the active region and contacts with the base region 5. The P-type Silicon-Germanium epitaxial layer is formed through the Silicon-Germanium epitaxial layer process of Silicon-Germanium heterojunction bipolar transistors (SiGe HBT), specifically, the P-type Silicon-Germanium epitaxial layer can be formed though the heavily doped P-type implantation of the non-intrinsic base region of SiGe HBT. The P-type Silicon-Germanium epitaxial layer of the emitter region is doped through ion implantation. The process conditions for doping are: the dose for the implantation is 5e14 cm$^{-2}$~5e15 cm$^{-2}$, the energy for the implantation is less than 10 keV and the impurity implanted is boron or boron difluoride. The position and size of the emitter region 9 are defined by a base region window formed in a first medium layer 8, which includes the following steps: forming the first medium layer 8 on the silicon substrate 1; forming the base region window through etching part of the first medium layer 8 on the active region located on the silicon substrate, wherein the base region window is located on the active region and is smaller than the active region; growing a P-type Silicon-Germanium epitaxial layer both in the base region window and on the first medium layer 8 and etching the P-type Silicon-Germanium epitaxial layer to form the emitter region 9, wherein the P-type Silicon-Germanium epitaxial layer formed inside the base region window contacts with the base region 5 and the P-type Silicon-Germanium epitaxial layer formed outside the base region window is smaller than the active region and is isolated from the base region 5 by the first medium layer 8.

Figure 2G:
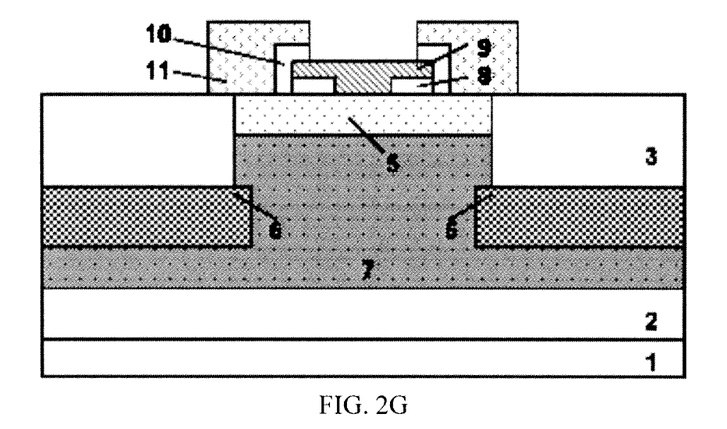

Step 8: as shown in FIG. 2F and FIG. 2G, forming N-type polysilicon 11 on the base region 5, wherein the N-type polysilicon 11 contacts with the base region 5. The process of forming the N-type polysilicon 11 includes the following steps: forming a second medium layer 10 on the silicon substrate 1; etching the second medium layer 10 to make the second medium layer 10 totally cover the emitter region 9 and the covered area is smaller than the size of the active region, that is, the lateral size of the covered area includes the lateral size of both the emitter region 9 and the second medium layer 10, and the lateral size of the covered area is smaller than that of the active region; removing part of the second medium layer other than the covered area. The N-type polysilicon 11 is deposited to make the N-type polysilicon 11 contact with the base region 5 and be isolated from the emitter region 9 by the second medium layer 10. The N-type polysilicon 11 is formed through the emitter polysilicon process of SiGe HBT and is doped through ion implantation. The process conditions are: the dose for the implantation is 1e14 cm$^{-2}$~1e16 cm$^{-2}$, the energy for the implantation is 150 keV~200 keV, and the impurity implanted is arsenic or phosphor.

Step 9: as shown in FIG. 1, forming deep-hole contacts 12 on the top of the pseudo buried layers 6 through the STIs 30 to pick up the collector; forming a metal contact 15 of the base region to pick up the base region; forming a metal contact 13 of the emitter region to pick up the emitter; finally forming metal lines 14 on the contacts of the collector, base and emitter to pick up their electrodes.

Figure 3A:
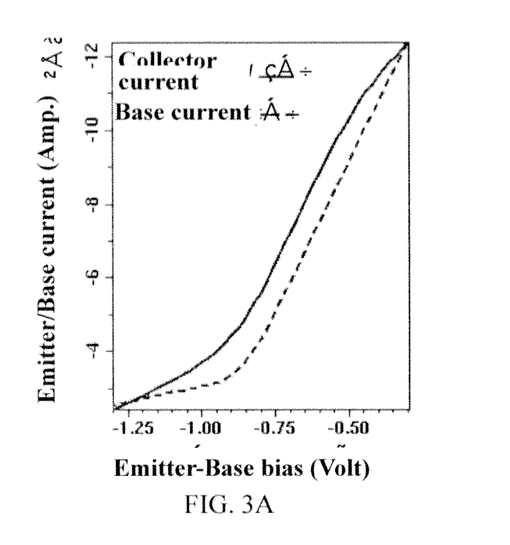
FIG. 3A shows the input characteristic curve of the vertical parasitic PNP transistor in a BiCMOS process in the embodiment of the present invention simulated by TCAD.
Figure 3B:
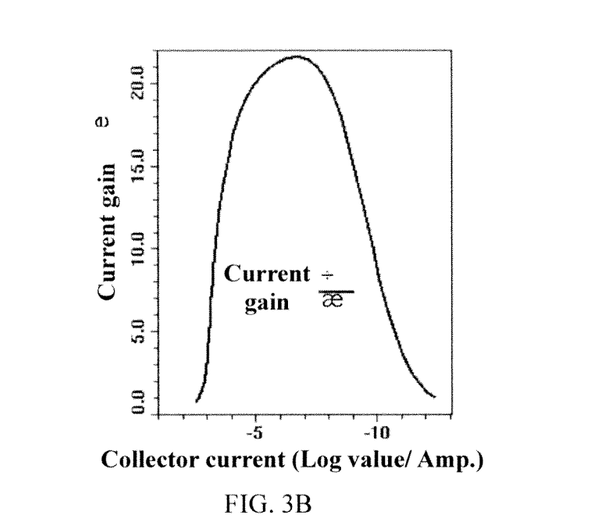
FIG. 3B shows the gain curve of the vertical parasitic PNP transistor in a BiCMOS process in the embodiment of the present invention simulated by TCAD.

Refer to FIG. 3A and FIG. 3B, which are respectively the input characteristic curve and the gain curve of the vertical parasitic PNP transistor in a BiCMOS process in the embodiment of the present invention simulated by TCA. From the curves, it can be seen that the area of the transistor is reduced efficiently compared with the prior art through adopting the advanced deep-hole contact process and picking up the collector of the transistor through the contacts directly formed on the P-type pseudo buried layers. Besides, because of the reduction of the distance between the picking up position and the collector as well as the highly doped P-type pseudo buried layers, the resistance of the collector is also effectively reduced, which helps improving the frequency characteristics of the transistor. Meanwhile, other features, such as the input characteristics and the current gain, not be affected, and the current gain can be maintained at 20 or more.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A vertical parasitic PNP transistor in a BiCMOS process, formed on a silicon substrate, wherein an active region is isolated by shallow trench isolations, comprising:
    a collector region, comprising a 9-type ion implantation region formed in the active region, wherein the collector region is deeper than or equal to the bottom of the shallow trench isolations;
    pseudo buried layers, comprising P-type ion implantation regions formed at the bottom of the shallow trench isolations located on both sides of the collector region, wherein the pseudo buried layers extend laterally into the active region and contact with the collector region, and the electrodes of the collector region are picked up through deep-hole contacts formed on top of the pseudo buried layers in the shallow trench isolations;
    abuse region, comprising an N-type ion implantation region formed on the collector region and contacting with the collector region;
    an emitter region, comprising a P-type Silicon-Germanium epitaxial layer formed on the base region and contacting with the base region, wherein the electrode of the emitter region is directly picked up through a metal contact;
    N-type polysilicon, formed on the base region and contacting with the base region, wherein the electrodes of the base region are picked up through metal contacts on the N-type polysilicon.

2. The vertical parasitic PNP transistor in a BiCMOS process according to claim 1, wherein the impurity implanted in the collector region through the P-type ion implantation is boron, and the implantation is realized through two steps:
    a dose for the implantation in Step 1 is 1e11 cm$^{-2}$~5e13 cm$^{-2}$, and an energy for the implantation in Step 1 is 100 keV~300 keV;
    a dose for the implantation in Step 2 is 5e11 cm$^{-2}$~1e13 cm$^{-2}$, and an energy for the implantation in Step 2 is 30 keV~100 keV.

3. The vertical parasitic PNP transistor in a BiCMOS process according to claim 1, herein the process conditions of the P-type ion implantation for the pseudo buried layers are:
    a dose for the implantation is 1e14 cm$^{-2}$~1e16 cm$^{-2}$,
    an energy for the implantation is less than 15 keV, and
    the impurity implanted is boron or boron difluoride.

4. The vertical parasitic PNP transistor in a BiCMOS process according to claim 1, wherein the process conditions of the N-type ion implantation for the base region are:
    the impurity implanted is phosphor or arsenic,
    an energy for the implantation is 100 Kev~300 Kev, and
    a dose for the implantation is 1e12 cm$^{-2}$~1e14 cm$^{-2}$.

5. The vertical parasitic PNP transistor in a BiCMOS process according to claim 1, wherein the P-type Silicon-Germanium epitaxial layer of the emitter region is doped through ion implantation, and the process conditions for the doping are:
    a dose for the implantation is 5e14 cm$^{-2}$~5e15 cm$^{-2}$,
    an energy for the implantation is less than 10 keV, and
    the impurity implanted is boron or boron difluoride.

6. The vertical parasitic PNP transistor in a BiCMOS process according to claim 1, wherein the N-type polysilicon is doped through ion implantation, and the process conditions are:
    a dose for the implantation is 1e14 cm$^{-2}$~1e16 cm$^{-2}$, an energy for the implantation is 150 keV~200 keV, and the impurity implanted is arsenic or phosphor.

7. The vertical parasitic PNP transistor in a BiCMOS process according to claim 1, wherein the size of the emitter region is smaller than that of the active region, and the size of the emitter region is defined by a base region window formed in a first medium layer formed on the silicon substrate, and the base region window is formed through etching parts of the first medium layer on the active region, and the base region window is located on the active region and is smaller than the active region.

8. The vertical parasitic PNP transistor in a BiCMOS process according to claim 1, wherein the N-type polysilicon is isolated from the emitter region by a second medium layer.

* * * * *